(12) United States Patent
Togawa et al.

(10) Patent No.: US 8,382,895 B2
(45) Date of Patent: Feb. 26, 2013

(54) SILICON SINGLE CRYSTAL MANUFACTURING METHOD, SILICON SINGLE CRYSTAL, SILICON WAFER, APPARATUS FOR CONTROLLING MANUFACTURE OF SILICON SINGLE CRYSTAL, AND PROGRAM

(75) Inventors: Shinji Togawa, Omura (JP); Toshiyuki Sato, Omura (JP)

(73) Assignee: Sumco Techxiv Corporation, Omura-Shi (JP)

( * ) Notice: Subject to any disclaimer, the term of this patent is extended or adjusted under 35 U.S.C. 154(b) by 1088 days.

(21) Appl. No.: 12/307,734

(22) PCT Filed: Sep. 27, 2007

(86) PCT No.: PCT/JP2007/068743
§ 371 (c)(1),
(2), (4) Date: Jan. 6, 2009

(87) PCT Pub. No.: WO2008/038689
PCT Pub. Date: Apr. 3, 2008

(65) Prior Publication Data
US 2009/0309069 A1    Dec. 17, 2009

(30) Foreign Application Priority Data
Sep. 29, 2006  (JP) .................................. 2006-267287

(51) Int. Cl.
*H01L 21/322* (2006.01)
*C30B 15/14* (2006.01)
*C30B 11/00* (2006.01)
*C30B 13/00* (2006.01)
*C30B 21/04* (2006.01)
*C30B 28/08* (2006.01)

(52) U.S. Cl. ...................... 117/37; 117/2; 117/3; 117/11
(58) Field of Classification Search .................. 117/2, 3, 117/11, 37
See application file for complete search history.

(56) References Cited

U.S. PATENT DOCUMENTS 5,217,565 A * 6/1993 Kou et al. .................... 75/10.11
5,367,981 A * 11/1994 Maruyama .................... 117/200
(Continued)

FOREIGN PATENT DOCUMENTS
CN    1865531 A    11/2006
JP    05-043382 A    2/1993
(Continued)

OTHER PUBLICATIONS

Extended European Search Report dated Nov. 18, 2010 (and English translation thereof) in counterpart European Application No. 07828489.0.

(Continued)

*Primary Examiner* — James McDonough
(74) *Attorney, Agent, or Firm* — Holtz, Holtz Goodman & Chick, PC (57) ABSTRACT

A method of manufacturing a silicon monocrystal by FZ method, wherein a P-type or N-type silicon crystal having been pulled up by CZ method is used as a raw material. While impurities whose conductivity type is the same as that of the raw material are supplied by a gas doping method, the raw material is recrystallized by an induction-heating coil for obtaining a product-monocrystal.

5 Claims, 7 Drawing Sheets

U.S. PATENT DOCUMENTS

2002/0020194 A1* 2/2002 Makikawa et al. ............. 65/379
2010/0116194 A1* 5/2010 Togawa et al. .................. 117/13

FOREIGN PATENT DOCUMENTS

| JP | 2005-035816 A | 2/2005 |
| JP | 2005-281076 A | 10/2005 |
| JP | 2005-306653 A | 11/2005 |
| RU | 2 049 164 C1 | 11/1995 |
| WO | WO 2006-003782 A1 | 1/2006 |

OTHER PUBLICATIONS

International Preliminary Report on Patentability and Written Opinion dated Apr. 22, 2009 (7 pages), issued in counterpart International Application Serial No. PCT/JP2007/068743.

English Language International Search Report dated Dec. 18, 2007 issued in parent Appln. No. PCT/JP2007/068743.

* cited by examiner

SILICON SINGLE CRYSTAL MANUFACTURING METHOD, SILICON SINGLE CRYSTAL, SILICON WAFER, APPARATUS FOR CONTROLLING MANUFACTURE OF SILICON SINGLE CRYSTAL, AND PROGRAM

This application is a U.S. National Phase Application under 35 USC 371 of International Application PCT/JP2007/068743 filed Sep. 27, 2007.

TECHNICAL FIELD

The present invention relates to a method of manufacturing a silicon monocrystal, a silicon monocrystal, a silicon wafer, a silicon monocrystal manufacturing-and-controlling apparatus, and a program.

BACKGROUND ART

A silicon monocrystal has been widely used as a semiconductor material. According to a typical method of manufacturing a silicon monocrystal, a silicon-polycrystal material is recrystallized to be grown as monocrystal ingot(s). The obtained silicon monocrystal is sliced into wafers of a predetermined thickness.

With respect to growing a silicon monocrystal, several technologies are under development so as to improve the quality thereof.

In principle, a crystal grown by a floating zone (FZ) method can be made to have resistivity distribution that is uniform in a longitudinal direction of the grown crystal by using a gas doping method on a polycrystalline material having high resistivity.

Meanwhile, in order to reduce manufacturing cost, there has been also a need for a grown crystal having a large diameter in a field of, for instance, a discrete device in recent years. It is preferable to use a silicon-polycrystal material having a diameter of 140 mm or more for manufacturing a grown crystal having a large diameter, particularly a diameter of 150 mm or more.

However, when such a silicon-polycrystal material having a large diameter is used, the manufacturing cost is contrarily increased because a price of such a raw material is set high due to an yield problem in manufacturing the raw material itself.

One solution of such a problem may be to use a P-type or N-type silicon crystal having been pulled up by CZochralski method as the raw material for forming a crystal by FZ method.

For instance, in order to manufacture a high-quality P-type or N-type silicon monocrystal of low resistivity, Patent Document 1 proposes a technology to recrystallize a silicon-material bar having resistivity of 0.1 Ω·cm (manufactured by CZ method) by FZ method.

Additionally, in order to manufacture a high-quality P-type or N-type silicon monocrystal of high resistivity, Patent Document 2 proposes a technology to recrystallize a silicon-material bar having resistivity of 1000 Ω·cm (manufactured by CZ method) by FZ method.

[Patent Document 1] JP-A-2005-281076
[Patent Document 2] JP-A-2005-306653

DISCLOSURE OF THE INVENTION

Problems to Be Solved by the Invention

However, the technologies disclosed in Patent Documents 1 and 2 may not necessarily provide a grown crystal having resistivity distribution that is uniform in a longitudinal direction of the crystal.

Specifically, according to the principle(s), a silicon crystal pulled-up by a typical CZ method does not have impurity distribution that is uniform in the longitudinal direction, and the resistivity tends to be lowered toward the latter half of the crystal.

Since the impurity distribution of the raw material is primarily ununiform, even by directly melting and recrystallizing the raw material by FZ method, a monocrystal having uniform resistivity distribution (i.e., a monocrystal that is comparable to a conventional product-monocrystal provided by using a gas doping method on a silicon polycrystal) may not be obtained. Although the distribution of a monocrystal is improved by some degree by melting the raw material from a low-resistivity side of the raw material, such a monocrystal is not suitable for practical use.

An object of the present invention is to provide a method of manufacturing a silicon monocrystal, a silicon monocrystal, a silicon wafer, a silicon monocrystal manufacturing-and-controlling apparatus and a program that are capable of providing a grown crystal that exhibits resistivity distribution equal to that of a product-monocrystal obtained by a conventional FZ method, and that are preferable for providing a product-monocrystal of a large diameter.

Means for Solving the Problems

A method of manufacturing a silicon monocrystal according to an aspect of the present invention includes: using a P-type or N-type silicon crystal having been pulled up by CZ method as a raw material; supplying impurities whose conductivity type is the same as that of the raw material by a gas doping method; and recrystallizing the raw material by the FZ method for obtaining a product-monocrystal.

According to the aspect of the present invention, since the gas-doping method is concurrently used when the raw material is melted by the FZ method, a melt zone can be supplied with impurities in accordance with the impurity concentration of the raw material by adjusting the doping-gas quantity. Hence, even when the raw material has the resistivity distributed along the material length direction as does the raw material having been pulled-up by CZ method, the longitudinal resistivity distribution of the product-monocrystal can be adjusted to be uniform.

Thus, a product-monocrystal having uniform resistivity can be provided even by recrystallizing in accordance with the FZ method a large-diameter ingot (raw material) having been pulled-up by CZ method, thereby suppressing the raw material cost irrespective of the large diameter of the product-monocrystal and reducing the manufacturing cost.

According to the aspect of the present invention, the method of manufacturing a silicon crystal preferably further includes: acquiring in advance resistivity distribution along a longitudinal direction of the raw material and target resistivity for the product-monocrystal; and calculating a doping-gas flow rate used in the gas doping method based on the acquired resistivity distribution of the raw material and the acquired target resistivity of the product-monocrystal.

The resistivity herein refers to volume resistivity [Ω·cm]. In order to obtain the resistivity distribution of the raw material by measuring, two-probe method and four-probe method may be employed.

Calculation of a doping-gas flow rate requires impurity concentration of the raw material. Resistivity and impurity concentration of a semiconductor are generally on a relationship of Irvin, so that the impurity concentration of the raw material can be unambiguously obtained based on Irvin's formula once the resistivity of the raw material is obtained.

A specific doping-gas flow rate $f(x)$ is preferably derived by: obtaining a difference $Cs-Cp(x)$ between impurity concentration $Cs$ of the product-monocrystal and impurity concentration $Cp(x)$ corresponding to a material length position (x), the impurity concentration $Cs$ being calculated based on the acquired target resistivity of the product monocrystal, the impurity concentration $Cp(x)$ being calculated based on the acquired resistivity distribution of the raw material; setting the difference $Cs-Cp(x)$ as impurity concentration $Cg(x)$ at which the impurities are supplied by the gas doping method in accordance with the material length position (x); and calculating a doping-gas flow rate $f(x)$ through a formula (1) as follows, where: "Ds" represents diameter of the product-monocrystal; "Vc" represents crystal growth speed; "n" represents doping-gas concentration; "α" represents gas absorptivity coefficient at which gas is absorbed into the product-monocrystal; and "A" is a constant.

$$f(x) = \frac{Cg(x) \times \pi (Ds/2)^2 \times Vc}{A \times n\alpha} \quad (1)$$

The formula (1) is derived in the following manner.

According to the principle of a conventional FZ method, by supplying a melt of constant impurity concentration to the product-monocrystal from the raw material, the impurity concentration of the product-monocrystal and the resistivity thereof become constant.

Where: "Cs(x)" represents the impurity concentration of the product-monocrystal; "Co" represents the impurity concentration of the raw material; "ko" represents segregation coefficient per impurity; "x" represents a material length position; and "w" represents width of the melt zone, a relationship of the above items is represented by a formula (2) as follows, in which the impurity concentration Co, staying constant in the longitudinal direction, is a constant. The material length position (x) is set as a coordinate value determined relative to a coordinate value 0 of a crystal shoulder of the raw material 6 at the time of pulling-up by CZ method.

$$Cs(x) = Co \times \left[1 - (1-ko) \times \exp\left(-\frac{ko \times x}{w}\right)\right] \quad (2)$$

However, when the silicon crystal pulled-up by the CZ method is used as the raw material, since the longitudinal impurity concentration of the raw material is not uniform, the formula (2) is not applicable.

Where: "CS" represents impurity concentration of the product-monocrystal corresponding to target resistivity; and "Cp(x)" represents the impurity concentration of the raw material having been pulled-up by the CZ method, impurity concentration $Cg(x)$ at which impurities should be supplied by the gas doping method is obtained by a formula (3) as follows.

[Formula 3]

$$Cg(x) = Cs - Cp(x) \quad (3)$$

Although the impurity concentration of the raw material is preferably derived from resistivity of the entire raw material having been measured in advance, the impurity concentration of the raw material can be obtained by computation provided that the raw material is pulled up by the CZ method under manufacturing conditions in which evaporation is ignorable.

Specifically, when a product-crystal is grown by the FZ method based on high-resistivity side of the silicon crystal material having been pulled-up by the CZ method, the impurity concentration $Cp(x)$ of the raw material is obtained by a formula (4) as follows, where: "Cpo" represents impurity concentration of the material shoulder; "g" represents solidification rate coefficient; and "k" represents segregation coefficient.

[Formula 4]

$$Cp(X) = Cpo(1-xg)^{k-1} \quad (4)$$

The solidification rate coefficient (g) can be obtained by a formula (5) as follows, where "Dp" represents diameter of the raw material; "ρs" represents material density; and "Wt" represents material weight when the silicon crystal is grown by CZ method.

$$g = \frac{\pi(Dp/2)^2 \times \rho s}{Wt} \quad (5)$$

In contrast, when a product-monocrystal is grown by the FZ method based on low-resistivity side of the raw material, the impurity concentration $Cp(x)$ of the raw material is obtained by a formula (6) as follows, where "G" represents solidification rate at the final position.

[Formula 6]

$$Cp(x) = Cpo(1-G+xg)^{k-1} \quad (6)$$

The solidification rate G at the final position is obtained by a formula (7) as follows, where "L" represents the entire length of the raw material.

$$G = \frac{\pi(Dp/2)^2 \times Lp \times \rho s}{Wt} \quad (7)$$

Next, where "Vc" represents growth speed of the product-monocrystal recrystallized by the FZ method and "Ds" represents diameter of the product-monocrystal, crystallized volume ΔV per unit time is obtained by a formula (8) as follows.

[Formula 8]

$$\Delta V = \pi(Ds/2)^2 \times Vc \quad (8)$$

Accordingly, impurity quantity ΔC1 required per unit time can be obtained by multiplication of the formula (3) and the formula (8), as is represented by a formula (9) as follows.

[Formula 9]

$$\Delta C1 = Cg(x) \times \pi(Ds/2)^2 \times Vc \quad (9)$$

On the other hand, considering that impurities are supplied from a doping-gas cylinder of concentration (N), impurity quantity ΔC2 incorporated into the product-monocrystal per unit time is obtained by a formula (10) as follows, where: "f" represents flow rate; "NA" represents Avogadro's number; "Vs" represents volume of the doping-gas in normal state; and "α" represents gas absorptivity coefficient at which gas is absorbed into the monocrystal.

$$\Delta C2 = \frac{NA}{Vs} \times f \times n \times \alpha \quad (10)$$

Hence, the gas flow rate should be controlled such that the formula (9) becomes equal to the formula (10). NA/Vs, which is constant, may be replaced by the constant A, such that the doping-gas flow rate f(x) at the material length position (x) can be obtained by the formula (1) as described above.

Thus, according to the aspect of the present invention, since the doping-gas flow rate can be suitably obtained in accordance with the resistivity distribution of the raw material having been pulled-up by the CZ method, the resistivity distribution of the product-monocrystal can be reliably made constant.

According to the aspect of the present invention, it is preferable that the gas absorptivity coefficient α is determined based on the target resistivity of the product monocrystal (i.e., impurity concentration in accordance with the target resistivity) and measured resistivity of the actually-recrystallized monocrystal (i.e., measured impurity concentration).

In order to set the gas absorptivity coefficient α, it is preferable to: initially set the gas absorptivity coefficient α to be exemplarily equal to 1; obtain the doping-gas flow rate f(x) based on the formula (1); and determine the gas absorptivity coefficient α based on measured resistivity of the product-monocrystal obtained through the above and target resistivity corresponding to the obtained doping-gas flow rate f(x). When the measured resistivity is larger than the target resistivity, the impurity quantity supplied by the gas doping method may be increased by decreasing the value of the gas absorptivity coefficient α to be less than 1. On the other hand, when the measured resistivity is smaller than the target resistivity, the impurity quantity supplied by the gas doping method may be decreased by increasing the value of the gas absorptivity coefficient to be more than 1.

According to the aspect of the present invention, since the product-monocrystal can be manufactured while both of the theoretically-obtained doping-gas quantity and changes of the manufacturing conditions such as degradation of an induction-heating coil are taken into consideration at the time of recrystallizing by the FZ method, the resistivity distribution of the product-monocrystal in the length direction of the product can be more reliably made uniform.

According to the aspect of the present invention, it is preferable that the gas doping method conducts gas doping at a doping-gas flow rate that is larger than the doping-gas flow rate calculated through the formula (1) during an initial stage of recrystallization by the FZ method.

Impurities are supplied by a constant quantity for realizing desired product resistivity based on the doping-gas quantity calculated through the formula (1). However, since the impurity concentration of the melt zone is not in a steady state during the initial stage of recrystallization, the resistivity of some portion unavoidably becomes larger than the target resistivity.

Thus, by conducting gas doping at a doping-gas flow rate that is larger than the doping-gas flow rate calculated through the formula (1) as described above, the melt zone can excessively absorb the doping gas during the initial stage of the recrystallization, such that the impurity concentration during the initial stage of the recrystallization can be equalized with that of the steady state. In this manner, a product-monocrystal having entirely uniform resistivity can be obtained.

A silicon monocrystal according to another aspect of the present invention is manufactured by any one of the above-described methods of manufacturing the silicon monocrystal.

According to the aspect of the present invention, the silicon monocrystal is manufactured by the method of manufacturing the silicon monocrystal according to the present invention, thereby providing a product-monocrystal having entirely uniform resistivity.

A silicon wafer according to still further aspect of the present invention is manufactured by slicing the above-described silicon monocrystal.

According to the aspect of the present invention, the silicon wafer is manufactured by slicing the silicon monocrystal according to the present invention, thereby providing a silicon wafer having entirely uniform resistivity.

A silicon monocrystal manufacturing-and-controlling apparatus according to still further aspect of the present invention is an apparatus that: uses a P-type or N-type silicon crystal having been pulled up by CZ method as a raw material; supplies impurities whose conductivity type is the same as that of the raw material by a gas doping method; and recrystallize the raw material by FZ method for obtaining a product-monocrystal, the apparatus including: a resistivity-distribution acquirer that acquires resistivity distribution along a longitudinal direction of the raw material; a target-resistivity acquirer that acquires target resistivity for the product-crystal obtained based the FZ method; a setter that obtains a difference Cs−Cp(x) between impurity concentration Cs of the product-monocrystal and impurity concentration Cp(x) corresponding to a material length position (x) and sets the difference Cs−Cp(x) as impurity concentration Cg(x) at which the impurities are supplied by the gas doping method in accordance with the material length position (x), the impurity concentration Cs being calculated based on the acquired target resistivity, the impurity concentration Cp(x) being calculated based on the acquired resistivity distribution of the raw material; a calculator that calculates a doping-gas flow rate f(x) through a formula (1) as follows, where "Ds" represents diameter of the recrystallized product-monocrystal, "Vc" represents crystal growth speed, "n" represents doping-gas concentration, "α" represents gas absorptivity coefficient at which gas is absorbed into the product-monocrystal, and "A" is a constant; and a controller that controls, based on the calculated doping-gas flow rate, a doping-gas flow rate at which gas is ejected from a gas-doping nozzle in accordance with the gas doping method.

A computer-readable program according to still further aspect of the present invention is a program that is used in a silicon monocrystal manufacturing-and-controlling apparatus, the apparatus: using a P-type or N-type silicon crystal having been pulled up by CZ method as a raw material; supplying impurities whose conductivity type is the same as that of the raw material by a gas doping method; and recrystallizing the raw material by FZ method for obtaining a product-monocrystal, the program operating the manufacturing-and-controlling apparatus as: a resistivity-distribution acquirer that acquires resistivity distribution along a longitudinal direction of the raw material; a target-resistivity acquirer that acquires target resistivity for the product-crystal obtained based the FZ method; a setter that obtains a difference Cs−Cp(x) between impurity concentration Cs of the product-monocrystal and impurity concentration Cp(x) corresponding to a material length position (x) and sets the difference Cs−Cp(x) as impurity concentration Cg(x) at which the impurities are supplied by the gas doping method in accordance with the material length position (x), the impurity concentration Cs being calculated based on the acquired target resistivity, the impurity concentration Cp(x) being calculated based on the acquired resistivity distribution of the raw material; a calculator that calculates a doping-gas flow rate f(x) through a formula (1) as follows, where "Ds" represents diameter of the recrystallized product-monocrystal, "Vc" represents crystal growth speed, "n" represents doping-gas concentration, "α" represents gas absorptivity coefficient at which gas is absorbed into the product-monocrystal, and "A" is a constant; and a controller that controls, based on the calculated doping-gas flow rate, a doping-gas flow rate at which gas is ejected from a gas-doping nozzle in accordance with the gas doping method.

In addition, according to the aspect of the present invention, the above-described program may be stored in a computer-readable storage medium.

According to the aspects of the present invention, by merely employing the above manufacturing-and-controlling apparatus in a facility for manufacturing silicon monocrystals by a typical FZ method or by merely installing the above program in a general-purpose manufacturing-and-controlling apparatus used for FZ method, the above-described effects and advantages can be obtained. In addition, since the doping-gas flow rate is automatically controlled, the raw material having been pulled-up by CZ method can be recrystallized by FZ method under an automatic control. With this arrangement, a great deal of improvement in operating efficiency can be expected.

BEST MODE FOR CARRYING OUT THE INVENTION

[1] Overall Arrangement of Apparatus

A first embodiment of the present invention will be described below with reference to the attached drawings.

Figure 1:
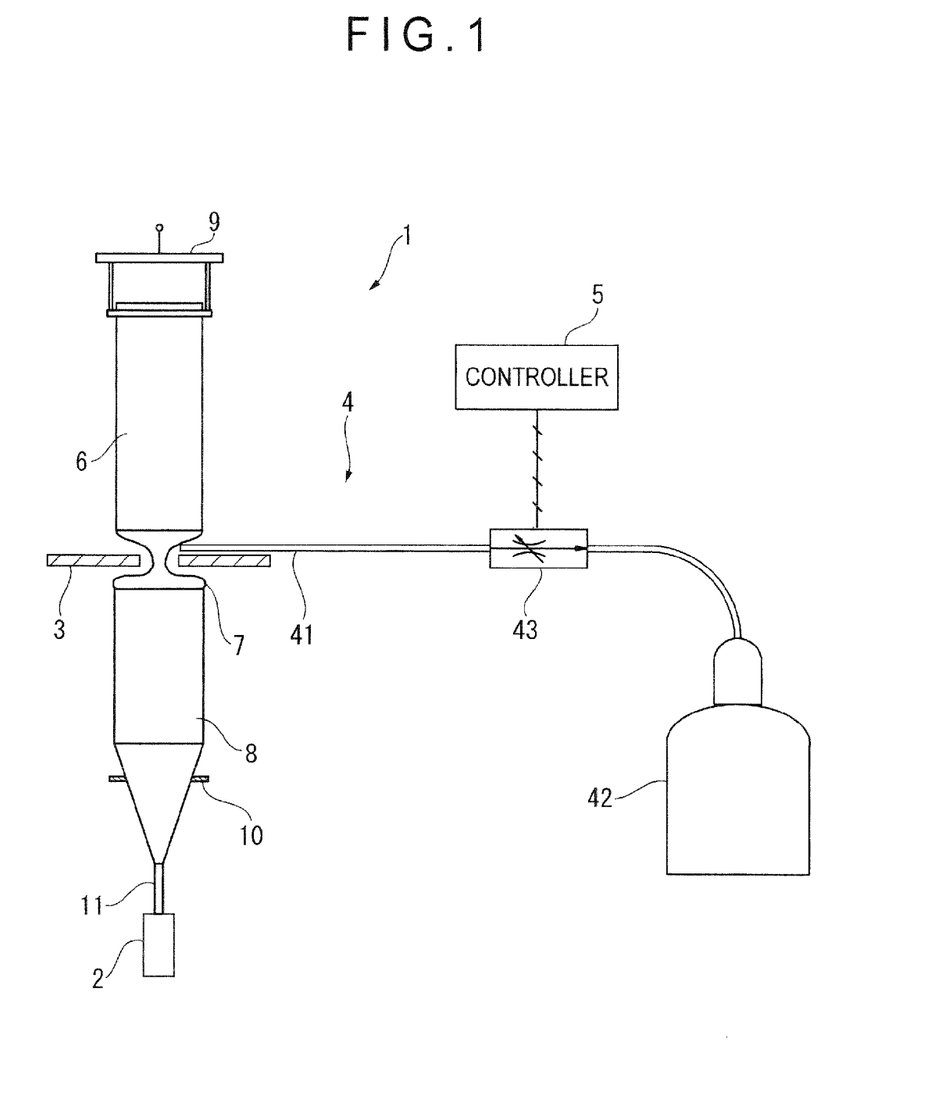
FIG. 1 is an illustration schematically showing an arrangement of an FZ monocrystal-manufacturing apparatus according to an embodiment of the present invention.

FIG. 1 is an illustration schematically showing an arrangement of an FZ monocrystal-manufacturing apparatus 1 according to an embodiment of the present invention.

The FZ monocrystal-manufacturing apparatus 1 includes a crystal holder 2, an induction-heating coil 3, a gas-doping apparatus 4, a controller 5, a material holder 9 and a product-monocrystal-weight holder 10.

She crystal holder 2 holds a tip end of a product-monocrystal 8, a weight of which is held by the product-monocrystal-weight holder 10. An upper end of a crystal raw material 6 is chucked by the ring-shaped material holder 9.

The induction-heating coil 3 is a ring-shaped component surrounding an outer circumference of the raw material 6.

The gas-doping apparatus 4 includes a doping-gas nozzle 41, a gas cylinder 42 and a flow-rate control valve 43. The gas cylinder 42 contains doping gas at a high pressure. Flow rate at which the doping gas is ejected by the doping-gas nozzle 41 is adjusted in accordance with opening degree of the flow-rate control valve 43. The doping-gas nozzle 41 is disposed in the vicinity of the induction-heating coil 3.

The controller 5, a detail of which will be described later, controls the flow rate of the doping-gas ejected from the gas-doping apparatus 4 in accordance with a longitudinal position (x) of the raw material 6.

In the above-described FZ monocrystal-manufacturing apparatus 1, while the upper end of the raw material 6 is held by the material holder 9, a lower end of the raw material 6 is melted by the induction-heating coil 3 fixed to a furnace. By bringing a seed crystal 11 fixed to the crystal holder 2 into contact with the melt portion and pulling the seed crystal 11 downwards, the melt portion is solidified while increasing its diameter until a desirable value. By simultaneously moving the raw material 6 downwards at this time, the lower end of the raw material 6 is continuously melted, so that a melt of an amount required for crystallization is supplied thereto.

The crystal having been grown to some degree is supported by the product-monocrystal-weight holder 10.

By blowing the doping gas to a melt zone 7 formed thereon via the gas-doping nozzle 41 during the above-described process, impurities are incorporated into the melt zone 7, i.e., the product-monocrystal 8.

[2] Resistivity Distribution of Material 6

The raw material 6, which is a p-type or n-type silicon crystal having been pulled up by the CZ method, can be manufactured by mixing doping impurities in a crucible and pulling tip a crystal in accordance with a typical CZ method. When the CZ method is employed for pulling up, impurity concentration of the raw material 6 becomes higher as a pulling-amount is increased from a start point of the pulling-up. Resistivity, which initially exhibits a high value, is accordingly reduced as the pulling-up amount is increased.

Examples of the doping impurities are phosphorus (P) as a p-type dopant, and boron (B), arsenic (As) and antimony (Sb) as n-type dopant(s).

The raw material may be mounted on the FZ monocrystal-manufacturing apparatus 1 with its high-resistivity side being placed at the lower end position or with its low-resistivity side being placed at the lower end position.

[3] Configuration of Controller 5

Figure 2:
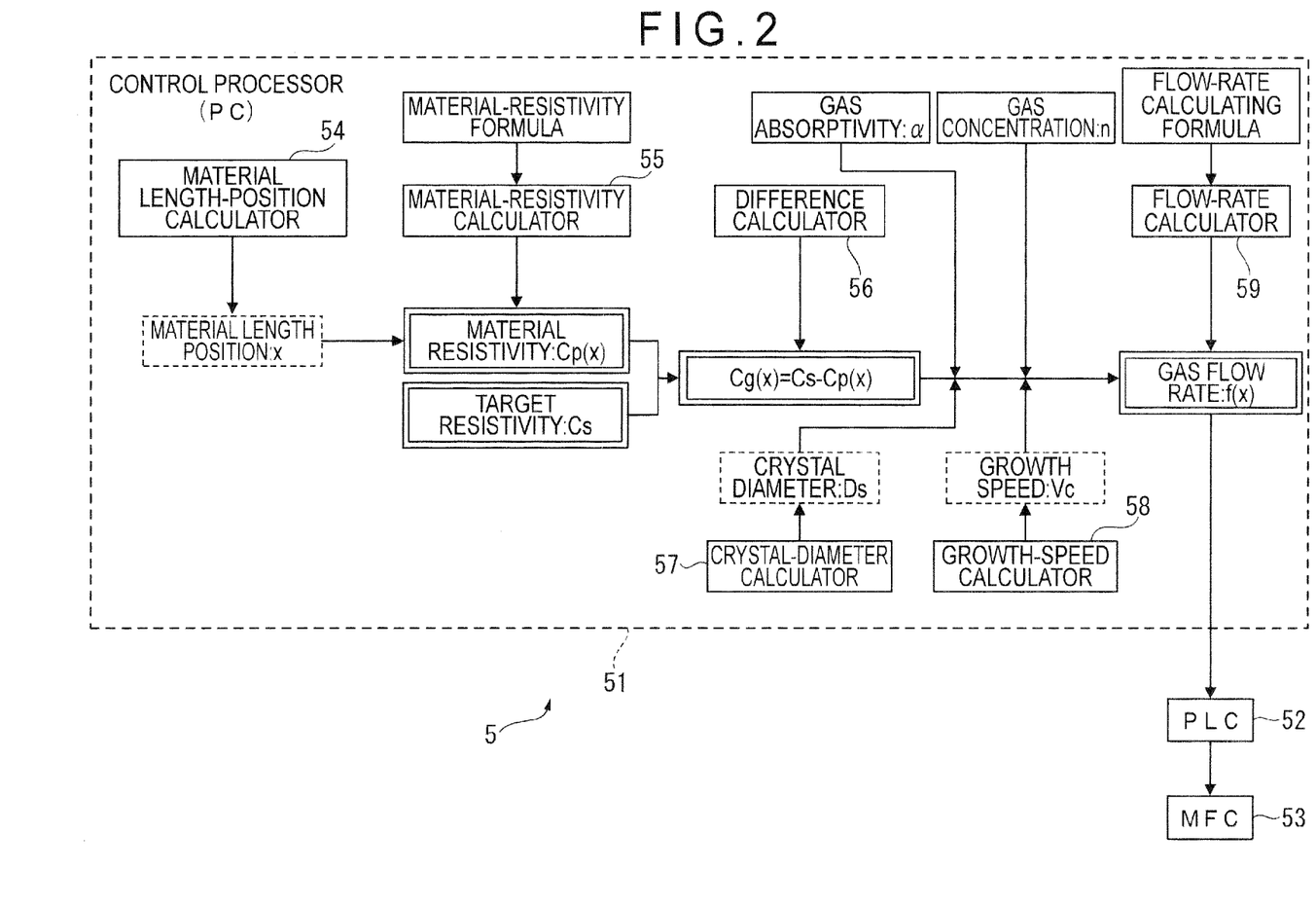
FIG. 2 is a block diagram showing an arrangement of a controller according to the embodiment.

FIG. 2 shows a block configuration and processing flow of the above-mentioned controller 5. The controller 5 includes a control processor 51, a programmable logic controller 52 and a flow-rate controller (mass flow controller) 53. The controller 5 controls the gas-doping apparatus 4 shown in FIG. 1.

The control processor 51, which is provided by a general-purpose computer having a CPU (central processing unit) and a storage such as a hard disc, calculates the flow rate at which the doping gas is supplied to the melt zone 7 by the gas-doping apparatus 4 based on resistivity distribution of the raw material 6 and target resistivity of the product-monocrystal provided by the FZ monocrystal-manufacturing apparatus, and outputs the calculated flow rate to the programmable logic controller 52.

The control processor 51 includes a material length-position calculator 54, a material-resistivity controller 55, a difference calculator 56, a crystal-diameter calculator 57, a growth-speed calculator 58 and a flow-rate calculator 59, which are all configured as program(s) executed by the CPU.

The material length-position calculator 54 calculates a position (x) at which the raw material 6 is currently melted based on a vertical position of the raw material 6 relative to the induction-heating coil 3, and acquires a value thereof. The position of the raw material 6 is acquired by a governing controller provided to the apparatus body.

Using a coordinate system where a coordinate value of a crystal shoulder of the raw material 6 at the time of pulling-up by the CZ method is 0, the material-resistivity calculator 55, based on the material length position (x) relative to the crystal shoulder, calculates the resistivity of the raw material 6 at the position (x) as impurity concentration Cp(x), at which melting of the raw material 6 is being conducted by the induction-heating coil 3. A relationship between the resistivity and the impurity concentration can be unambiguously obtained by Irvin's formula.

The impurity concentration Cp(x) is calculated based on a material-resistivity formula stored in the storage. When the raw material is mounted on the apparatus with the high-resistivity side being placed at the lower end position, the impurity concentration Cp(x) can be obtained by a formula (11) as follows, where: "Cpo" represents the impurity concentration of the lower end of the raw material 6 (i.e., the shoulder of the CZ crystal); "g" represents solidification rate coefficient; "k" represents segregation coefficient; "Dp" represents diameter of the raw material; "ρs" represents material density; and "Wt" represents material weight when the silicon crystal is grown by the CZ method.

$$Cp(x) = Cpo(1 - xg)^{k-1} \quad (11)$$

$$g = \frac{\pi(Dp/2)^2 \times \rho s}{Wt}$$

On the other hand, when the raw material 6 is mounted on the apparatus with the low-resistivity side being placed at the lower end position, the impurity concentration is obtained by a formula (12) as follows, where "G" represents solidification rate at the final position and "L" represents the entire length of the raw material 6. In this case, "Cpo" is a value of the upper end of the raw material 6 (i.e., the shoulder of the CZ crystal).

$$Cp(x) = Cpo(1 - G + xg)^{k-1} \quad (12)$$

$$G = \frac{\pi(Dp/2)^2 \times Lp \times \rho s}{Wt}$$

Although the resistivity of the raw material 6 can be calculated by the material-resistivity calculator 55 based on the formulae (11) and (12), the resistivity may be obtained by physically measuring the raw material 6 in accordance with two-probe method or four-probe method and converting the measured value into the impurity concentration according to Irvin's formula. When such a measured value as described above is used, the resistivity distribution of the raw material 6 can be more accurately obtained.

The difference calculator 56 calculates a difference between the impurity concentration Cp(x) of the raw material calculated by the material-resistivity calculator 55 and impurity concentration Cs corresponding to the target resistivity of the product-monocrystal 8, and sets the calculated difference as impurity concentration Cg(x) at which the impurities are supplied to the melt zone 7 by the gas-doping apparatus 4.

The crystal-diameter calculator 57 calculates a crystal diameter Ds of the finally-obtained product-monocrystal 8 while the growth-speed calculator 58 calculates a crystal growth speed Vc at which the recrystallization is conducted by the FZ manufacturing apparatus 1.

The flow-rate calculator 59 calculates a gas flow rate f(x) based on a flow-rate calculating formula, using the impurity concentration Cg(x) calculated by the difference calculator 56 for supplying impurities by the gas-doping apparatus 4, the crystal diameter Ds calculated by the crystal-diameter calculator 57, the crystal growth speed Vc calculated by the growth-speed calculator 58, and gas absorptivity α and gas concentration "n" stored in the storage in advance. Specifically, the gas flow rate f(x) is calculated based on a formula (13) as follows. "A" in the formula (13) represents a constant.

$$f(x) = \frac{Cg(x) \times \pi(Ds/2)^2 \times Vc}{A \times n\alpha} \quad (13)$$

The gas flow rate f(x) calculated by the control processor 51 as described above is output to the programmable logic controller 52. The programmable logic controller 52 generates such control signal as analog current value based on the gas flow rate f(x) to output the signal to the flow-rate controller 53. The flow-rate controller 53 controls opening degree of the flow-rate control valve 43 based on the control signal.

When the resistivity of the product-monocrystal 8 deviates from the target resistivity or the resistivity distribution of the product-monocrystal 8 is increased during the manufacturing, the gas flow rate f(x) calculated based on the formula (13) is changed by changing the gas absorptivity coefficient α.

The product-monocrystal 8 (ingot) provided by the FZ monocrystal-manufacturing apparatus 1 as described above is sliced with high accuracy into silicon wafers of a predetermined thickness by a diamond blade or the like.

According to the embodiment described above, since a gas-doping method is concurrently used when the raw material 6 is melted by the FZ method, the melt zone 7 can be supplied with impurities in accordance with the impurity concentration of the raw material 6 by adjusting the doping-gas quantity. Hence, even when the resistivity is distributed along the material length direction in the raw material 6 as in the raw material 6 having been pulled up by the CZ method, the longitudinal resistivity distribution of the product-monocrystal 8 can be adjusted to be uniform.

EXAMPLES

Adjustment of Material 6

Next, Example(s) according to the present invention will be described. It should be noted that the present invention is not limited to the Example(s).

A n-type silicon crystal added with phosphorus (P) was manufactured by a typical CZ method so that the shoulder of the crystal had resistivity of 100 Ω·cm. The crystal diameter Dp at that time was 155 mm while the cylindrical length L was 1150 mm.

By grinding the outer circumference of the silicon crystal, the tip end of the silicon crystal was tapered, so that the raw material 6 according to FZ method was manufactured.

Example 1

A product-monocrystal 8 having a diameter of 155 mm and a cylindrical length of 800 mm was manufactured by: tapering the high-resistivity side of the raw material 6; setting the gas flow rate based on the formula (13) with the target resistivity being 20 Ω·cm; flowing the doping gas into the furnace together with carrier gas (Ar) during the pulling-up at the gas flow rate set as a function of the length of the raw material 6; and zoning the raw material 6 at the crystal growth speed of 2.5 mm/min.

Figure 3:
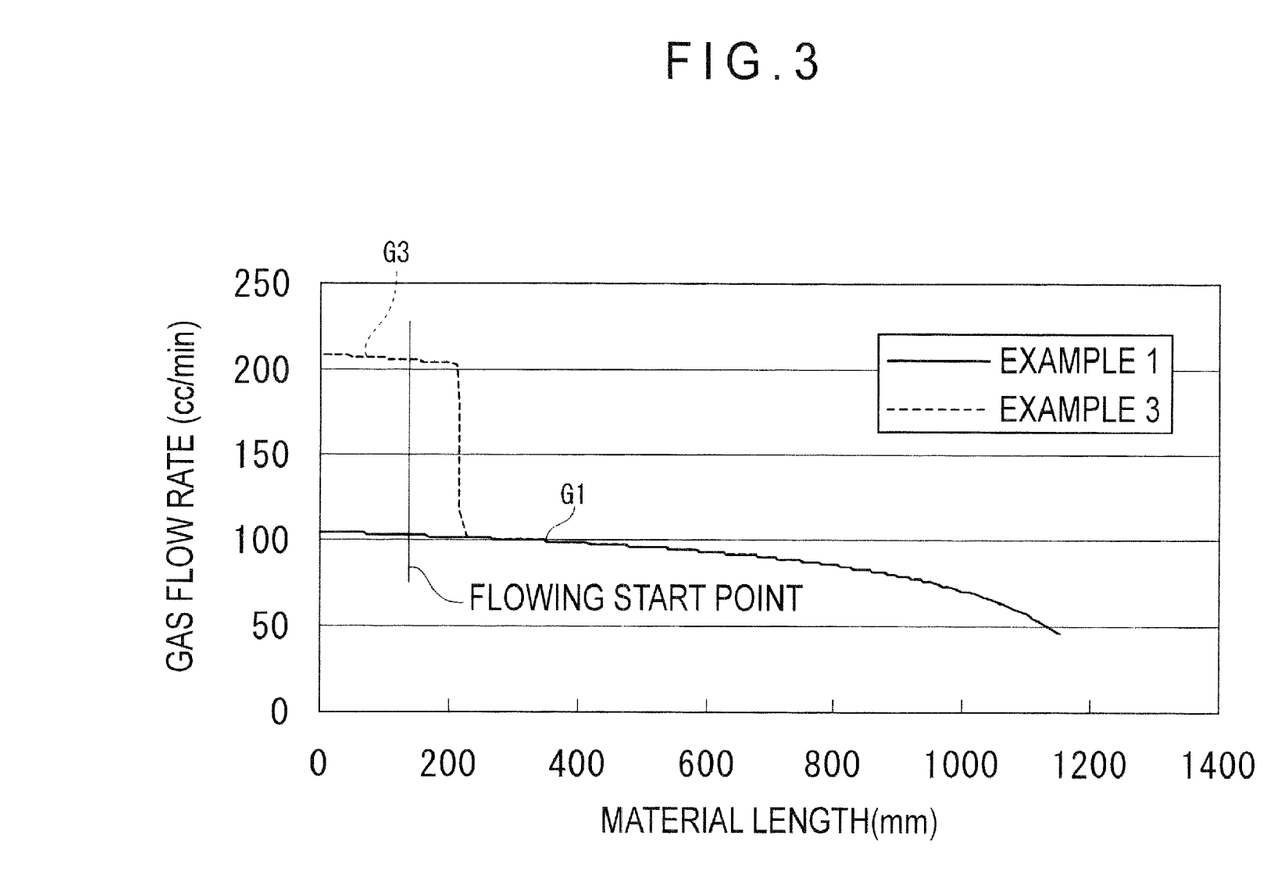
FIG. 3 is a graph showing changes of gas quantity when gas doping according to Examples 1 and 3 of the present invention were respectively conducted.

The gas flow rate, whose change is represented by the graph G1 of FIG. 1, was reduced as melting of the latter half of the raw material 6 went on. In FIG. 3, the tip end of the tapered portion of the raw material 6 corresponds to the material length of 0 while a position where gas flowing was started corresponds to a position where the entirety of the tapered portion had been melted.

Example 2

A product-monocrystal 8 having a diameter of 155 mm and a cylindrical length of 800 mm was manufactured by: tapering the low-resistivity side of the same raw material 6 as that of the Example 1; setting the gas flow rate based on the formula (13) with the target resistivity being 20 Ω·cm; flowing the doping gas into the furnace together with carrier gas (Ar) during the pulling-up at the gas flow rate that was set as a function of the length of the raw material 6; and zoning the raw material 6 at the crystal growth speed of 2.5 mm/min.

Figure 4:
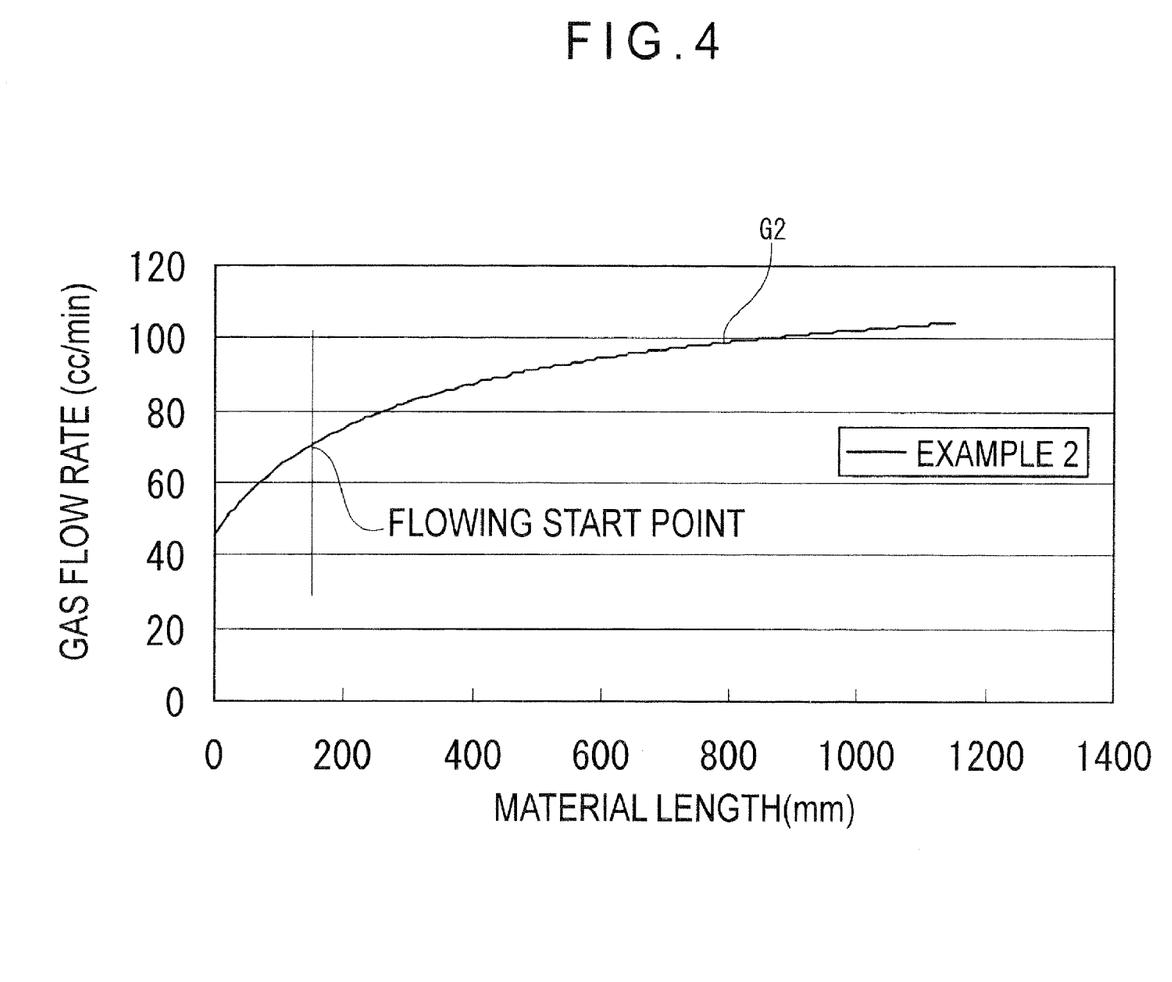
FIG. 4 is a graph showing a change of gas quantity when gas doping according to Example 2 of the present invention was conducted.

The gas flow rate, whose change is represented by the graph G2 of FIG. 4, was increased as melting of the latter half of the raw material 6 went on. As in the Example 1, in FIG. 4, the tip end of the tapered portion of the raw material 6 corresponds to the material length of 0 while a position where gas flowing was started corresponds to a position where the entirety of the tapered portion had been melted.

Example 3

Using the raw material 6 whose high-resistivity side was tapered as in the Example 1, a product-monocrystal 8 having a diameter of 155 mm and a cylindrical length of 800 mm was manufactured by setting the gas flow rate in the same manner as in the Example 1 and zoning the raw material 6 at the material growth speed of 2.5 mm/min.

As is represented by the graph of FIG. 3, the Example 3 differs from the Example 1 in that the gas was supplied in a quantity that was substantially twice as large as the gas quantity obtained by the formula (13) up to a position 50 mm away from the position where the entirety of the tapered portion had been melted. The gas quantity thereafter was the same as in the Example 1.

Comparative

In accordance with a typical FZ method, a product-monocrystal 8 having a diameter of 155 mm and a cylindrical length of 800 mm was manufactured from the raw material 6 whose low-resistivity side was tapered as in the Example 2 by zoning the raw material 6 at the material growth speed of 2.5 mm/min. The crystal was manufactured with no impurity gas being flown during the crystal growth.

Observation

Figure 5:
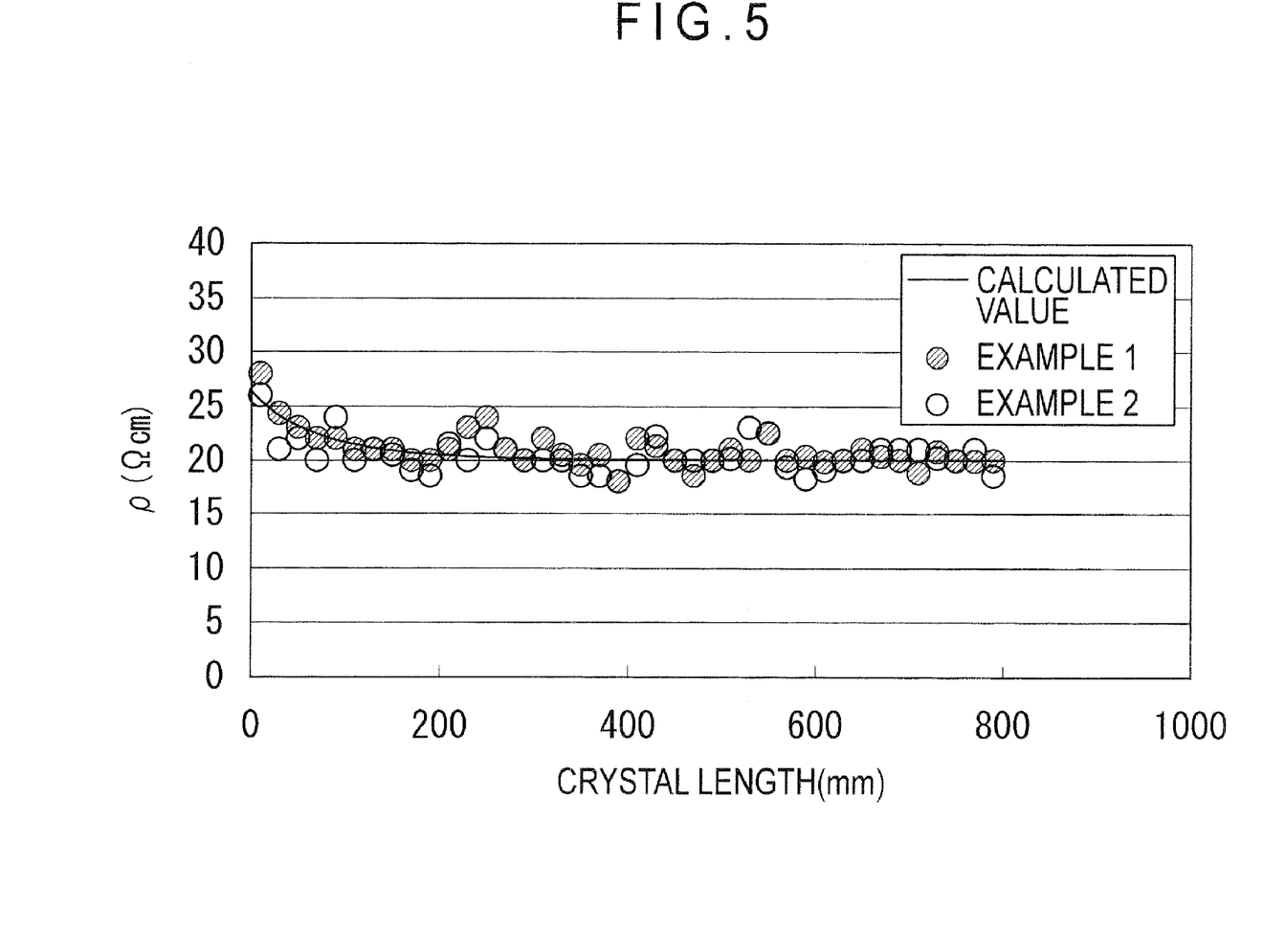
FIG. 5 is a graph showing resistivity distribution of product-monocrystals respectively obtained in accordance with the Examples 1 and 2.

As shown in FIG. 5, although both of the Examples 1 and 2 exhibited a slight increase of the resistivity during an initial stage of the crystal length, it has been observed that both of the Examples 1 and 2 can provide a product-monocrystal(s) 8 whose resistivity is stable nearly throughout the entirety.

Figure 6:
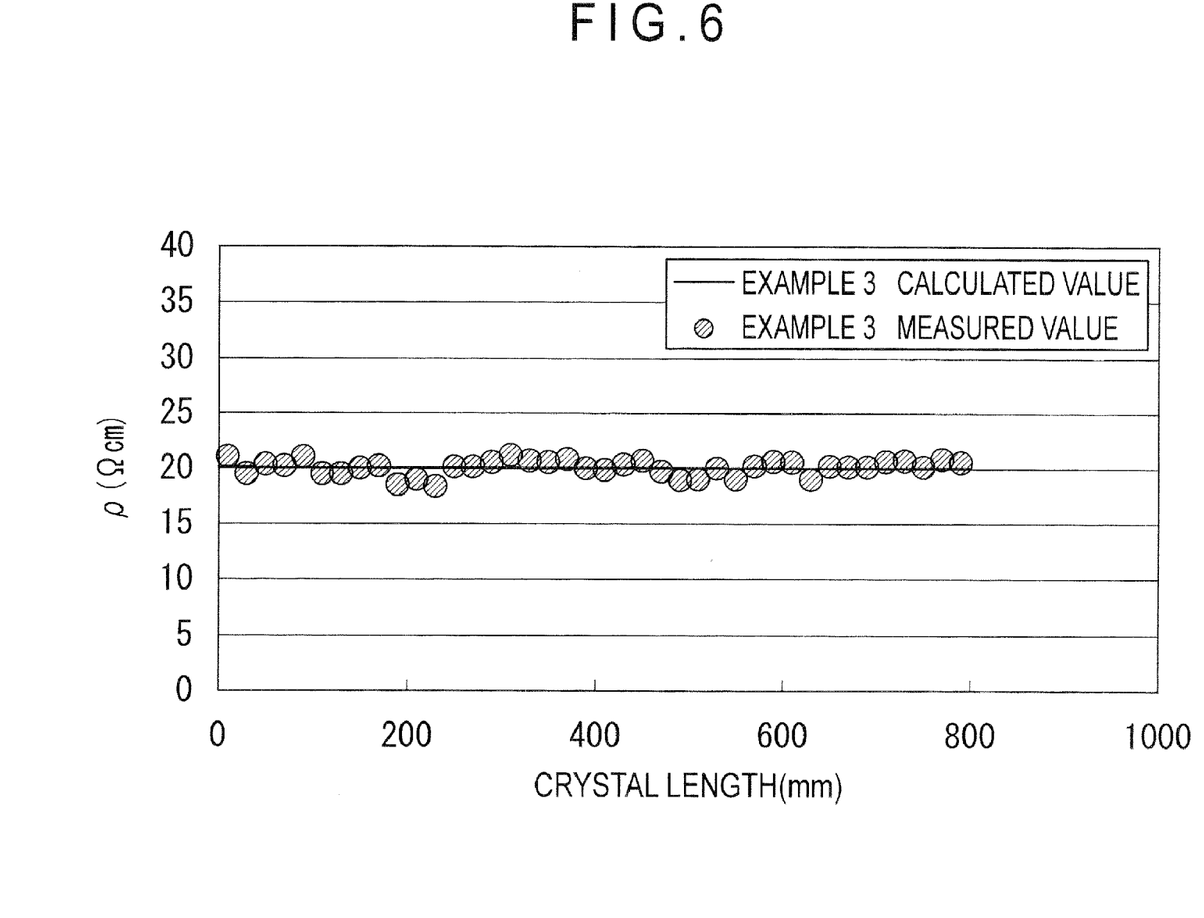
FIG. 6 is a graph showing resistivity distribution of a product-monocrystal obtained in accordance with the Example 3.

On the other hand, as is shown in FIG. 6, it has been observed that the Example 3 can provide a product-monocrystal 8 whose resistivity is stable even in the initial stage of the crystal length by supplying approximately the double quantity of the doping gas during an initial stage of the recrystallization.

Figure 7:
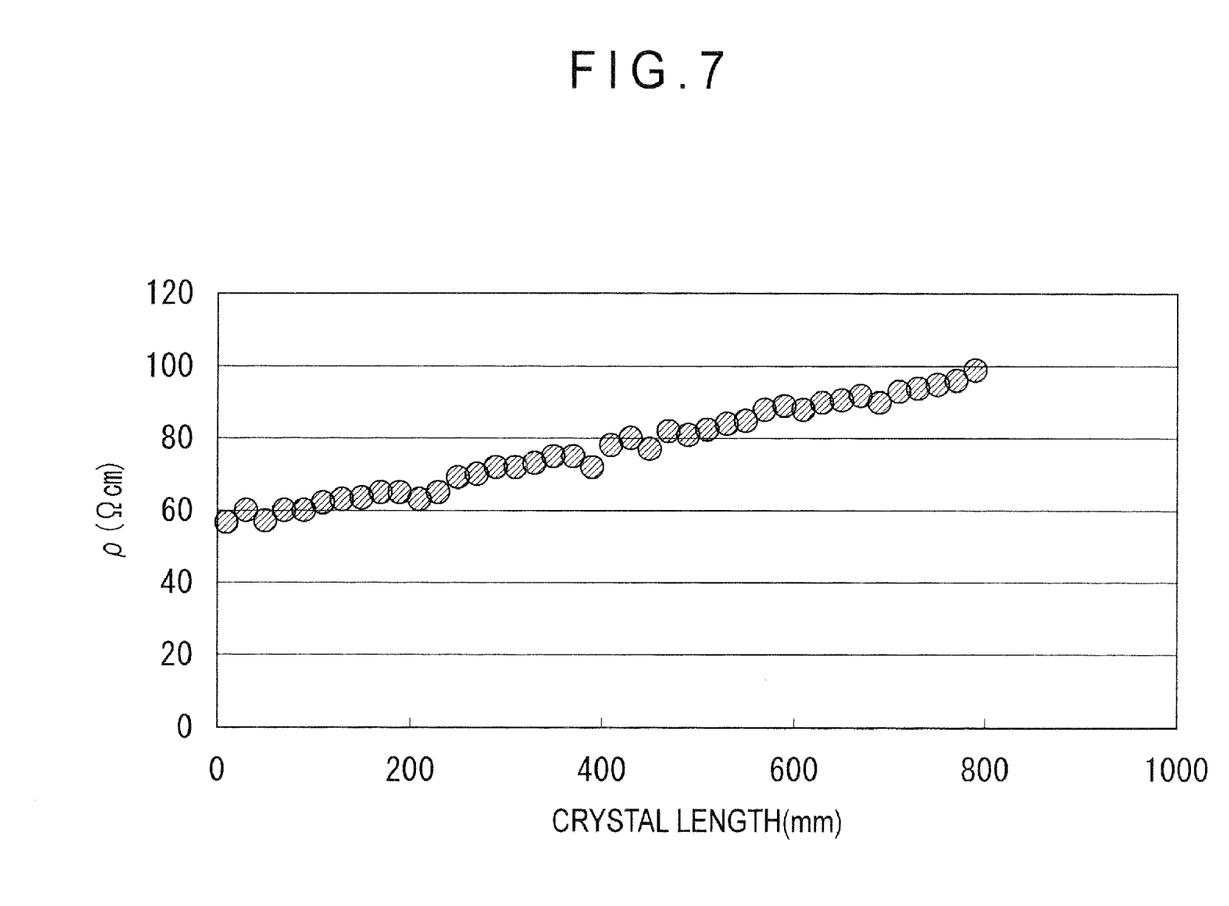
FIG. 7 is a graph showing resistivity distribution of a product-monocrystal obtained in accordance with Comparative.

In contrast, as shown in FIG. 7, the Comparative exhibited resistivity distribution in the crystal length direction with the resistivity being gradually increased from a first end toward a second end. Hence, the Comparative is not practically applicable.

The invention claimed is:

1. A method of manufacturing a silicon monocrystal by FZ method, comprising:
    using a P-type or N-type silicon crystal having been pulled up by CZ method as a raw material; and
    supplying impurities whose conductivity type is the same as that of the raw material by a gas doping method; and
    recrystallizing the raw material by the FZ method for obtaining a product-monocrystal.

2. The method of manufacturing a silicon crystal according to claim 1, further comprising:
    acquiring in advance resistivity distribution along a longitudinal direction of the raw material and target resistivity for the product-monocrystal; and
    calculating a doping-gas flow rate used in the gas doping method based on the acquired resistivity distribution of the raw material and the acquired target resistivity of the product-monocrystal.

3. The method of manufacturing a silicon crystal according to claim 2, wherein:
    a difference Cs−Cp(x) between impurity concentration Cs of the product-monocrystal and impurity concentration Cp(x) corresponding to a material length position (x) is obtained, the impurity concentration Cs being calculated based on the acquired target resistivity of the product monocrystal, the impurity concentration Cp(x) being calculated based on the acquired resistivity distribution of the raw material,
    the difference Cs−Cp(x) is set as impurity concentration Cg(x) at which the impurities are supplied by the gas doping method in accordance with the material length position (x), and
    the doping-gas flow rate f(x) is calculated through the following formula, where: "Ds" represents diameter of the product-monocrystal; "Vc" represents crystal growth speed; "n" represents doping-gas concentration; "α" represents gas absorptivity coefficient at which gas is absorbed into the product-monocrystal; and "A" is a constant $$f(x) = \frac{Cg(x) \times \pi (Ds/2)^2 \times Vc}{A \times n\alpha}$$

4. The method of manufacturing a silicon crystal according to claim 3, wherein the gas absorptivity coefficient α is determined based on the target resistivity of the product monocrystal and measured resistivity of the actually-recrystallized product-monocrystal.

5. The method of manufacturing a silicon crystal according to claim 3, wherein the gas doping method conducts gas doping at a doping-gas flow rate that is larger than the doping-gas flow rate calculated through the formula (1) during an initial stage of recrystallization by the FZ method.

* * * * *